US012628581B2

(12) United States Patent
Yong et al.

(10) Patent No.: US 12,628,581 B2
(45) Date of Patent: May 12, 2026

(54) SUBSTRATE PROCESSING METHOD

(71) Applicant: ASM IP Holding B.V., Almere (NL)

(72) Inventors: SangHeon Yong, Yongin-si (KR);
HongSuk Kim, Yongin-si (KR);
JuHyuk Park, Hwaseong-si (KR);
KiHun Kim, Yongin-si (KR); SungHa Choi, Suwon-si (KR)

(73) Assignee: ASM IP Holding B.V., Almere (NL)

( * ) Notice: Subject to any disclaimer, the term of this patent is extended or adjusted under 35 U.S.C. 154(b) by 445 days.

(21) Appl. No.: 18/132,547

(22) Filed: Apr. 10, 2023

(65) Prior Publication Data

US 2023/0335399 A1 Oct. 19, 2023

Related U.S. Application Data

(60) Provisional application No. 63/330,653, filed on Apr. 13, 2022.

(51) Int. Cl.
| | |
|---|---|
| *H01L 21/02* | (2006.01) |
| *H10P 14/60* | (2026.01) |
| *H10P 14/694* | (2026.01) |
| *H10W 74/01* | (2026.01) |

(52) U.S. Cl.
CPC ...... *H10P 14/6532* (2026.01); *H10P 14/6336* (2026.01); *H10P 14/6687* (2026.01); *H10P 14/69433* (2026.01); *H10W 74/01* (2026.01)

(58) Field of Classification Search
None
See application file for complete search history.

(56) References Cited

U.S. PATENT DOCUMENTS

| | | | | |
|---|---|---|---|---|
| 2013/0230987 A1* | 9/2013 | Draeger | ............ | H01L 21/02164 |
| | | | | 438/694 |
| 2020/0388483 A1 | 12/2020 | Sun | | |
| 2021/0198429 A1* | 7/2021 | Liu | ........................ | C08G 77/26 |

* cited by examiner

*Primary Examiner* — Asok K Sarkar
(74) *Attorney, Agent, or Firm* — Snell & Wilmer L.L.P.

(57) ABSTRACT

A substrate processing method comprising a gap-fill process is disclosed. The method includes providing a substrate in which a gap is formed in a surface thereof to a reaction space, supplying an oligomeric silicon precursor and a nitrogen-containing gas to the reaction space, forming a silicon nitride film having flowability on the substrate to fill at least a portion of the gap of the substrate while maintaining the reaction space in a plasma state, and densifying the silicon nitride film.

20 Claims, 19 Drawing Sheets

100

PROVIDE SUBSTRATE INTO REACTION SPACE — 110

SUPPLY SILICON PRECURSOR AND
NITROGEN-CONTAINING GAS INTO REACTION SPACE — 120

FORM FLOWABLE SILICON NITRIDE FILM ON SUBSTRATE — 130

FIG. 6 pore

SUBSTRATE PROCESSING METHOD

CROSS-REFERENCE TO RELATED APPLICATIONS

This application claims priority to U.S. Provisional Patent Application Ser. No. 63/330,653 filed Apr. 13, 2022 titled SUBSTRATE PROCESSING METHOD, the disclosure of which is hereby incorporated by reference in its entirety.

BACKGROUND

1. Field

The present disclosure relates to a method of processing a substrate, and more particularly, to a method of filling the inside of a gap formed on a surface of the substrate with a material having flowability.

2. Description of the Related Art

A gap-fill process is widely used in a semiconductor manufacturing process and referred to as a filling process for filling a gap in a gap structure, such as a shallow trench isolation (STI), with an insulating material or a conductive material. On the other hand, as the degree of integration of semiconductor devices increases, the aspect ratio (NR) of the gap in the gap structure is also increasing, and accordingly, due to limitations of a conventional deposition process, it is also getting more and more difficult to fill the inside of the gap having a high aspect ratio in void-free.

A chemical vapor deposition (CVD) method or a plasma enhanced chemical vapor deposition (PECVD) method is generally used as a deposition technique in the semiconductor manufacturing process, and in such methods, a source gas and a reaction gas are supplied simultaneously into a reaction space to deposit a desired film on a substrate, and therefore, there is an advantage that the film-forming rate is high. However, when the gap-fill process is performed on the substrate with gaps having the high aspect ratio using the CVD method, the film-forming rate in an upper region of the gap, that is, near an inlet region of the gap, is relatively faster than in a lower region of the gap. Accordingly, there is a disadvantage in that the inlet region of the gap is firstly closed.

FIGS. 1A and 1B are diagrams conceptually showing a process in which a void is formed in a gap in a conventional gap-fill process. Referring to FIG. 1A, a gap structure in which a gap 11 is formed in a substrate 10 is shown. For example, when the gap-fill process is performed on the substrate 10 having the gap 11 formed in a surface thereof by the CVD method, a gap-fill layer 12 is formed on the exposed surface of the substrate 10 having the gap 11. The gap-fill layer 12 is relatively conformally formed along a bottom surface and a portion of sidewall surfaces of the gap among the exposed surfaces of the gap, but the gap-fill layer 12 is formed to be relatively thicker in the inlet region of the gap 11, that is, in the upper region thereof, than in the lower region of the gap 11. That is, as the gap-fill layer 12 is formed to be thicker, the rate at which a width $W_1$ decreases in the upper region of the gap 11 becomes greater than the rate at which the width W2 decreases in the lower region of the gap 11.

Referring to FIG. 1B, as the gap-fill process further proceeds, a thickness of the gap-fill layer 12 in the upper region of the gap 11 becomes thicker, and the width $W_1$ in the upper region of the gap 11 gradually decreases. In the end, when the gap-fill layers 12 meet each other along the periphery of the gap 11 in the upper region of the gap 11, the upper region of the gap 11 is closed while forming a void 14 inside the gap 11.

Accordingly, despite the increasing of the aspect ratio of the gap in the semiconductor manufacturing process, there is a need for a technique for filling the gap without the occurrence of the void in the gap.

SUMMARY

Additional aspects will be set forth in part in the description which follows and, in part, will be apparent from the description, or may be learned by practice of the presented embodiments of the disclosure.

The present disclosure provides a substrate processing method in which a gap may be filled with a gap-fill layer without the occurrence of a void in the gap in a gap-fill process of a semiconductor manufacturing process.

The present disclosure provides a substrate processing method to prevent external impurities from penetrating into a gap-fill layer filled without voids in a gap-fill process.

The present disclosure provides a substrate processing method for forming a silicon nitride film having flowability on the substrate.

According to an aspect of the present disclosure, there is provided a method of processing a substrate, the method including: providing the substrate in which a gap is formed in a surface thereof in a reaction space, supplying an oligomeric silicon precursor and a nitrogen-containing gas in the reaction space, forming a silicon nitride film having flowability on the substrate to fill at least a portion of the gap of the substrate while maintaining the reaction space in a plasma state, and densifying the silicon nitride film.

In some embodiments, the oligomeric silicon precursor may be in a form of an oligomer having 2 to about 10 chain structures. In some embodiments, the nitrogen-containing gas may include at least one selected from $N_2$, $N_2O$, $NO_2$, $NH_3$, $N_2H_2$, $N_2H_4$, at least one of radicals thereof, and mixtures thereof. In some embodiments, the oligomeric silicon precursor may be trimer-trisilylamine (TSA) and the nitrogen-containing gas may be $NH_3$.

In some embodiments, in the step of forming the silicon nitride film, a temperature of the substrate may be maintained between about 0° C. and about 100° C. In some embodiments, in the step of forming the silicon nitride film, the temperature of the substrate may be maintained between about 30° C. and about 70° C.

In some embodiments, in the step of supplying the oligomeric silicon precursor and the nitrogen-containing gas, the oligomeric silicon precursor and the nitrogen-containing gas may be supplied so that the ratio of the Si atoms vs N atoms in the silicon nitride film is 1:1 or more.

In some embodiments, in the step of forming the silicon nitride film, while supplying the oligomeric silicon precursor and the nitrogen-containing gas into the reaction space, RF power may be applied to the reaction space to directly generate plasma over the substrate by an in-situ plasma treatment method.

In some embodiments, the step of densifying the silicon nitride film may be performed using any one selected from plasma treatment, UV treatment, or a rapid thermal process, for the silicon nitride film. In some embodiments, the step of densifying the silicon nitride film is performed using plasma processing, and the plasma processing may be performed by an in-situ plasma treatment method in which plasma is directly generated over the substrate while supplying He or Ar gas.

In some embodiments, the steps of forming the silicon nitride film and densifying the silicon nitride film are performed at the same process temperature, and in the step of densifying the silicon nitride film, a second RF power greater than a first RF power applied to the reaction space in the step of forming the silicon nitride film may be applied to the reaction space. In some embodiments, the first RF power may be in a range of about 100 W to about 500 W, and the second RF power may be in the range of about 300 W to about 1,500 W.

In some embodiments, the steps of forming the silicon nitride film and densifying the silicon nitride film are performed under RF power of the same magnitude, and the step of densifying the silicon nitride film may be performed at a second process temperature greater than a first process temperature in the step of forming the silicon nitride film.

In some embodiments, the steps of forming the silicon nitride film and densifying the silicon nitride film may be repeatedly performed a plurality of times, respectively. In some embodiments, the steps of forming the silicon nitride film and densifying the silicon nitride film may constitute one super-cycle, and the super-cycle may be performed a plurality of times according to the degree of filling of the silicon nitride film to be formed within the gap.

According to an aspect of the present disclosure, there is provided a method of processing a substrate, the method including: providing the substrate to a reaction space, supplying an oligomeric silicon precursor having 2 to about 10 chain structures and a nitrogen-containing gas into the reaction space, and forming a silicon nitride film having flowability on the substrate while maintaining the reaction space in a plasma state.

In some embodiments, the method may further include densifying the silicon nitride film after the step of forming the silicon nitride film.

In some embodiments, the nitrogen-containing gas may include at least one selected from $N_2$, $N_2O$, $NO_2$, $NH_3$, $N_2H_2$, $N_2H_4$, at least one of radicals thereof, and mixtures thereof.

In some embodiments, in the step of forming the silicon nitride film, the temperature of the substrate may be maintained between about 30° C. and about 70° C.

In some embodiments, in the step of supplying the oligomeric silicon precursor and the nitrogen-containing gas, the oligomeric silicon precursor and the nitrogen-containing gas may be supplied so that the ratio of the Si atoms vs N atoms in the silicon nitride film is 1:1 or more.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5A is a diagram illustrating a molecular structure of an example of an oligomer that may be used in a method of processing a substrate, according to example embodiments of the present disclosure;

FIG. 5B is a diagram illustrating a molecular structure of another example of an oligomer that may be used in a method of processing a substrate, according to example embodiments of the present disclosure;

FIG. 6 is a diagram illustrating an example of a molecular structure reaction formula that may be used in a method of processing a substrate, according to example embodiments of the present disclosure;

DETAILED DESCRIPTION

Figure 1A:
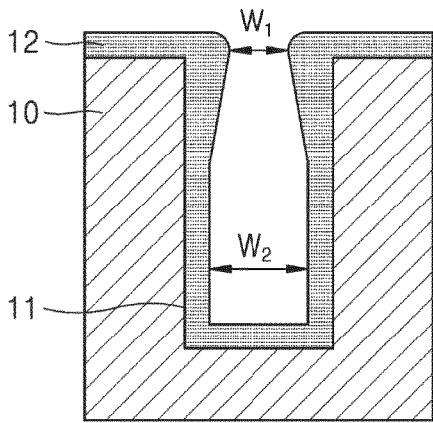
FIGS. 1A and 1B are cross-sectional views conceptually showing a process in which a void is formed in a gap structure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings.

Embodiments of the present disclosure are provided to further explain the present disclosure to one of ordinary skill in the art, and the following embodiments may have different forms and the scope of the present disclosure should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any particular order, upper and lower, or importance, but rather are only used to distinguish one member, region, layer, and/or section from another member, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

First, according to example embodiments of the present disclosure, a method of processing a substrate for forming a flowable film having flowability, for example, a silicon nitride film on a substrate will be described.

Figure 2:
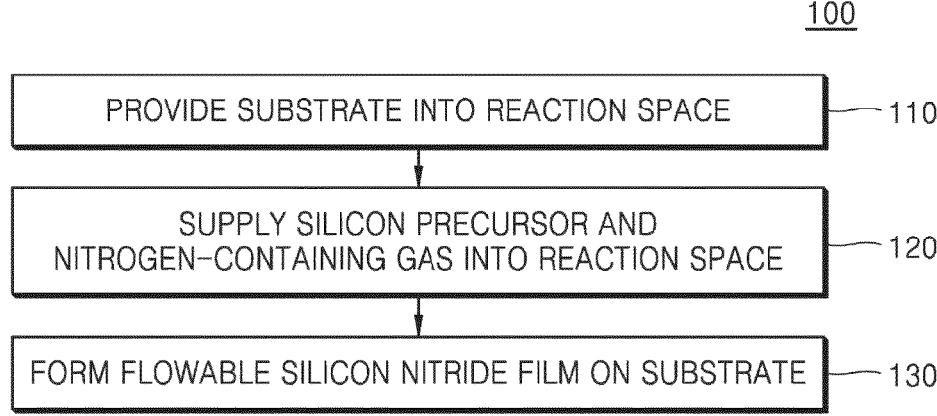
FIG. 2 is a flowchart illustrating a method of processing a substrate, according to example embodiments of the present disclosure.

FIG. 2 is a flowchart illustrating a method 100 of processing a substrate, according to example embodiments of the present disclosure.

Referring to FIG. 2, the substrate may be provided to a reaction space (110). The reaction space may be, for example, a reaction chamber in which a semiconductor manufacturing process may be performed. The substrate may include various substrates on which a flowable silicon nitride film, which may be formed according to example embodiments of the present disclosure, may be formed. A surface of the substrate on which the silicon nitride film may be formed may include, for example, a single material, such as a conductive material, an insulating material, and a semiconductor material, or two or more different materials. On the other hand, the surface geometry of the substrate on which the silicon nitride film may be formed may vary. For example, the surface of the substrate may be a flat surface parallel to a horizontal plane, or a surface inclined at a constant angle to the horizontal plane. Furthermore, the surface of the substrate may be a convex or concave surface to the horizontal plane.

As described later, the silicon nitride film formed on the substrate may have flowability, and a flow direction of the silicon nitride film may be closely related to a direction of force applied to the silicon nitride film. For example, when gravity acts on the silicon nitride film, the flow direction of the silicon nitride film may be the direction in which gravity acts on the silicon nitride film. Therefore, when the surface of the substrate is a convex surface, the silicon nitride film may be formed while flowing from a convex portion toward the periphery thereof. On the other hand, when the surface of the substrate is a concave surface recessed from the horizontal plane, the silicon nitride film having flowability may be formed while flowing toward a concave portion thereof. As examples of a case in which the surface of the substrate is concave in the semiconductor manufacturing process, there may be, for example, a gap structure, a via structure, or a stepped structure, and the like.

Referring back to FIG. 2, a silicon precursor and a nitrogen-containing gas may be supplied to the reaction space in which the substrate is provided (120). When the molecular structure of the supplied silicon source is too simple, for example, when the silicon source is a monomer or a single molecule, a vapor pressure thereof is high and thus the silicon source gets volatilized easily, and accordingly, the silicon source may lose the flowability. On the other hand, when the molecular structure of the silicon source is a complicated polymer, a molecular weight thereof is large and thus the vapor pressure thereof is low, so the flowability of the silicon source may be too low, and thus the efficiency may be lowered in a process that requires the flowability above an appropriate magnitude. For example, when a flowable film is used to fill the gap and the degree of flowability of the flowable film is insufficient, a void may occur in the gap. Therefore, as a silicon precursor used in example embodiments of the present disclosure, an oligomeric silicon source having a molecular structure that is not excessively simple and not excessively complicated, for example, having 2 to about 10 chain structures, may be used. The oligomeric silicon source may include, for example, dimer-trisilylamine (TSA), trimer-TSA, tetramer-TSA, pentamer-TSA, hexamer-TSA, heptamer-TSA, octamer-TSA, and the like.

In some embodiments, the oligomeric silicon source may be supplied alone to the reaction space, respectively, and for example, dimer-TSA as the silicon source may be supplied alone to the reactive space, and in other embodiments, trimer-TSA as the silicon source may be supplied alone to the reactive space. In addition, in some embodiments, two or more kinds of oligomeric silicon precursor sources may be supplied together to the reaction space. For example, in some embodiments, dimer-TSA and trimmer-TSA may be simultaneously supplied as the silicon precursor source, in some other embodiments, trimmer-TSA and tetramer-TSA may be simultaneously supplied as the silicon precursor source, and in yet other embodiments, dimer-TSA, trimmer-TSA, and tetramer-TSA may be simultaneously supplied to the reaction space.

Figure 5A:
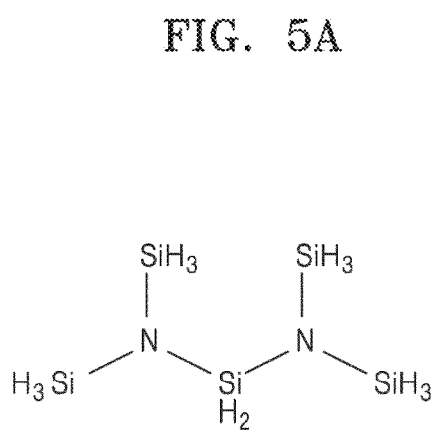
Figure 5B:
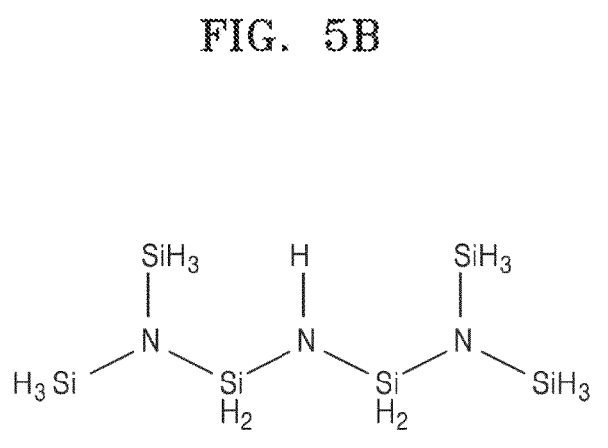

FIG. 5A shows a molecular structure of dimer-TSA comprising of two chain structures containing monomer-TSAs and FIG. 5B shows a molecular structure of trimmer-TSA comprising of three chain structures containing monomer-TSAs.

On the other hand, the nitrogen-containing gas to be used in the example embodiments of the present disclosure may include at least one selected from $N_2$, $N_2O$, $NO_2$, $NH_3$, $N_2H_2$, $N_2H_4$, at least one of radicals thereof, and mixtures thereof. In some embodiments, $NH_3$ may be used as the nitrogen-containing gas. The nitrogen-containing gas may promote condensation reaction and crosslinking in the process of oligomerization of the oligomeric silicon precursor.

Referring back to FIG. 2, a silicon nitride film having flowability may be formed on the substrate (130). A temperature of the substrate in the reaction space may be maintained, for example, about 100° C. or less, preferably about 30° C. to about 70° C. Alternatively, a process temperature in the reaction space may be maintained, for example, about 100° C. or less, preferably about 30° C. to about 70° C. Alternatively, a temperature of a vessel containing the silicon source may be maintained, for example, about 100° C. or less, preferably about 30° C. to about 70° C. Then, RF power of about 100 W to about 500 W, preferably about 200 W to about 400 W, may be applied to the reaction space to generate a plasma state in the reaction space. In this case, RF frequency used may be in a range of 13 MHz to 60 MHz, preferably about 20 MHz to about 30 MHz. In order to generate a plasma state in the reaction space, in example embodiments of the present disclosure, an in-situ plasma treatment may be used, in which RF power is directly applied to the reaction space while supplying the silicon precursor source and the nitrogen-containing gas together in the reaction space, to generate plasma over the substrate.

The oligomeric silicon precursor supplied to the reaction space together with the nitrogen-containing gas may flow with flowability on the substrate by thermal energy supplied to the substrate in the reaction space under the plasma state, and thus, the silicon nitride film having flowability may be formed on the substrate. At this time, the temperature of the substrate may be maintained at a relatively low temperature, for example, about 100° C. or less, preferably between about 30° C. to about 70° C., so that the substrate has appropriate flowability. As described above, when the silicon precursor source of the monomer or the single molecule is supplied to the substrate maintained in such a temperature range, the silicon precursor source may easily be volatilized, and thus lose flowability. Conversely, when the polymer having the complicated molecular structure is supplied, the silicon precursor may not have significant flowability. Therefore, in such a temperature range of the substrate, to ensure that the silicon source has flowability on the substrate to be significant and suitable for the semiconductor manufacturing process, the oligomeric silicon source having the molecular structure that is not excessively simple and not excessively complicated, for example, having a chain structure of 2 to about 10 chains, may be used.

The oligomeric silicon precursor source supplied to the substrate may flow on the substrate, and when flowing, bonds may occur between the oligomer precursor source molecules to form a structure that has at least about 10 chain structures. This is called oligomerization. The oligomerization may be facilitated through the condensation reaction between the oligomeric source molecules. In the condensation reaction, hydrogen may be removed as a reaction by-product in a Si—H bond of the silicon precursor source. The oligomers bonded through the condensation reaction may form a cross-linking structure through cross-linking while flowing within the silicon nitride film having flowability.

Subsequently, although not shown, after forming the silicon nitride film having flowability on the substrate, the surface of the silicon nitride film may be densified to prevent external impurities, such as oxygen or carbon, from penetrating into the silicon nitride film. The densification of the silicon nitride film will be described later.

Figure 3:
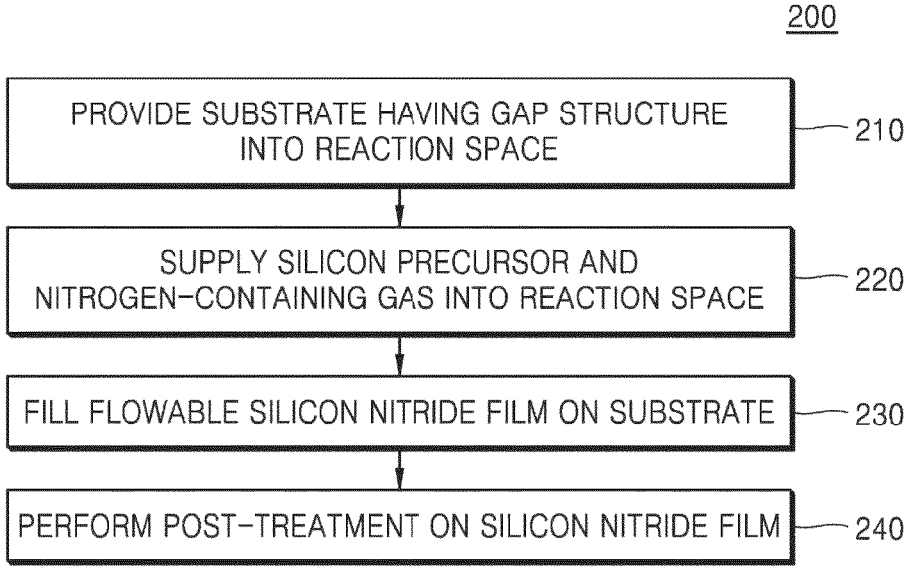
FIG. 3 is a flowchart illustrating a method of processing a substrate, according to another example embodiment of the present disclosure.

FIG. 3 is a flowchart illustrating a method 200 of processing a substrate, according to another example embodiment of the present disclosure. Specifically, this embodiment relates to filling the flowable silicon nitride film within a gap by applying example embodiments of the present disclosure of FIG. 2 to a substrate having a gap structure formed on the surface thereof. Descriptions previously given with respect to FIG. 2 are omitted.

Referring to FIG. 3, a substrate having a gap structure may be provided in the reaction space (210). The substrate having a gap structure is not limited to a gap structure formed generally on the surface of a semiconductor device. That is, the substrate to which the present example embodiments may be applied may have a structure having various types of recess regions or concave regions which may be concentrically filled with the flowable silicon nitride film while the flowable silicon nitride film flows under the influence of gravity, when the silicon nitride film having flowability is formed on the substrate. Specifically, the structure having recess regions or concave regions may include, for example, a gap structure in a general sense, such as STI to be formed for defining an active region in the semiconductor manufacturing process, a via structure penetrating an insulating layer to connect a conductive layer to another conductive layer in a conductive layer/insulating layer/conductive layer structure, another via structure penetrating a conductive layer to connect an insulating layer to another insulating layer in an insulating layer/conductive layer/insulating layer structure, and a stepped structure having a step shape in the depth direction from the surface thereof, and the like. Hereinafter, application of example embodiments of the present disclosure to the substrate having a gap structure in a general sense, as a representative of the structure having recess regions or concave regions, will be described.

Referring back to FIG. 3, the silicon precursor and the nitrogen-containing gas may be supplied to the reaction space to which the substrate having a gap structure is provided (220). As described above, as the silicon precursor used in example embodiments of the present disclosure, the oligomeric silicon source having the molecular structure that is not excessively simple and not excessively complicated, for example, the chain structure of 2 to about 10 chains, may be used. Such oligomeric silicon sources may be respectively supplied alone to the reaction space, or two or more kinds of silicon precursor sources may be supplied together to the reaction space. On the other hand, the nitrogen-containing gas to be used in the example embodiments of the present disclosure may include at least one selected from $N_2$, $N_2O$, $NO_2$, $NH_3$, $N_2H_2$, $N_2H_4$, at least one of radicals thereof, and mixtures thereof.

Referring back to FIG. 3, a flowable silicon nitride film may be formed in the gap (230). The temperature of the substrate in the reaction space may be maintained, for example, about 100° C. or less, preferably about 30° C. to about 70° C. The temperature of the substrate may be controlled by directly controlling the temperature of the substrate in the reaction space, or by controlling the process temperature in the reaction space or the temperature of a vessel containing the silicon precursor source to, for example, about 100° C. or less, preferably about 30° C. to about 70° C. Then, RF power of about 100 W to about 500 W, preferably about 200 W to about 400 W, may be applied to the reaction space to generate a plasma state in the reaction space. In order to generate a plasma state in the reaction space, in the example embodiments of the present disclosure, the in-situ plasma treatment may be used, in which RF power is directly applied to the reaction space while supplying the silicon precursor source and the nitrogen-containing gas together to the reaction space, to generate plasma directly over the substrate.

The oligomeric silicon precursor supplied to the reaction space together with the nitrogen-containing gas may flow with flowability on the substrate by thermal energy supplied to the substrate in the reaction space under the plasma state, so that, due to the flowability itself, the silicon nitride film having flowability may fill the gap concentrically that is formed on the surface of the substrate. As described above, when the silicon precursor source comprising of monomer or single molecule is supplied to the substrate maintained in such a temperature range, the silicon precursor source may be easily volatilized, and thus lose flowability. Conversely, when the silicon precursor source comprising of polymer having the complicated molecular structure is supplied, the flow of the silicon precursor source may be too slow, so that the silicon nitride film may be first formed in the inlet region of the gap before reaching the lower region thereof, thereby closing the inlet region of the gap.

Figure 1B:
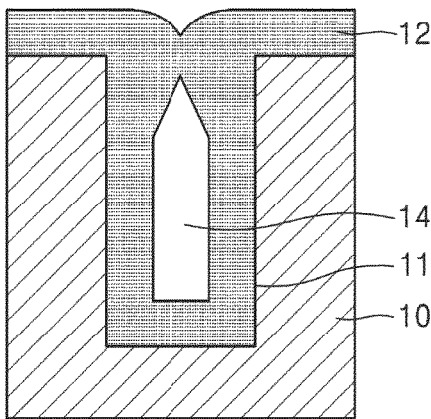

Therefore, a void similar to that shown in FIG. 1B may be formed in the gap. Therefore, in order to prevent volatilization of the silicon precursor source and prevent the occurrence of voids in the gap, in the range of the substrate temperature according to example embodiments of the present disclosure, there is a need for the silicon precursor source to ensure that the silicon precursor source has flowability on the substrate to be significant and suitable for the semiconductor manufacturing process to smoothly fill the gap on the substrate. To this end, the oligomeric silicon source having a molecular structure that is not excessively simple and not excessively complicated, for example, a chain structure of 2 to about 10 chains, may be used. The oligomeric silicon precursor source supplied to the substrate may flow on the substrate, and when flowing on the substrate, the oligomeric silicon precursor source may form a structure that has at least about 10 chain structures through the condensation reaction between the oligomeric silicon precursor source molecules. Thereafter, the oligomers bonded through the condensation reaction may have flowability to form the cross-linking structure through the cross-linking while flowing within the silicon nitride film.

Figure 6:
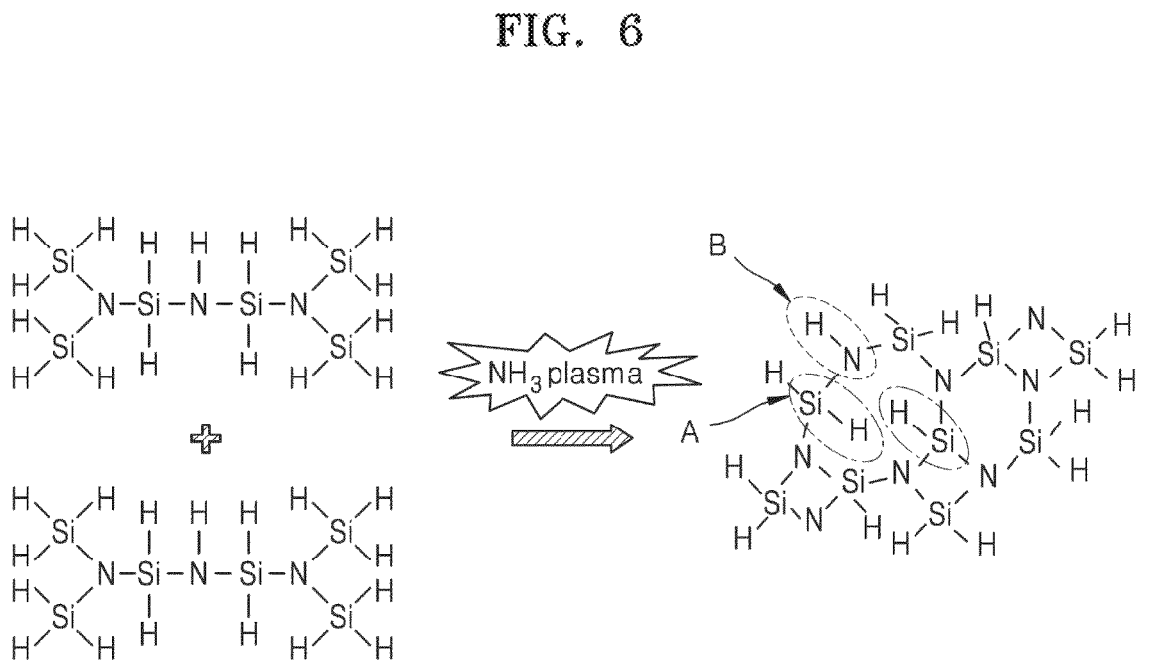

FIG. 6 is a diagram illustrating an example of a reaction mechanism that may be applied to a method of processing a substrate, according to example embodiments of the present disclosure. That is, FIG. 6 shows a process of forming a silicon nitride film with cross-linking structure while the trimer-TSA supplied to the reaction space as the silicon precursor source flows along the surface of the substrate, and while the two trimmer-TSAs undergo the condensation reaction and cross-linking under $NH_3$ plasma conditions.

On the other hand, as described above, the nitrogen-containing gas to be used in the example embodiments of the present disclosure may include at least one selected from $N_2$, $N_2O$, $NO_2$, $NH_3$, $N_2H_2$, $N_2H_4$, at least one of radicals thereof, and mixtures thereof. The nitrogen-containing gas may facilitate the cross-linking in the oligomerization process. More specifically, when the gap is filled with only the oligomeric silicon precursor source molecule, NH pores may occur in the gap, and due to the NH pores, a bonding structure of the formed silicon nitride film may be incomplete. With respect to the silicon nitride film with the cross-linking structure shown on the right side of FIG. 6, when a Si—H dangling bonds (for example, part A in FIG. 6) exists in the cross-linking structure consisting of a Si—N chain structure, or when a N—H dangling bonds (for example, such as part B in FIG. 6 shown for reference, although actually not shown in FIG. 6) exists in the cross-linking structure consisting of a Si—N chain structure, micro pores may occur in a corresponding cross-linking structure. Such micro pores may occur when the condensation reaction does not proceed sufficiently or when a polymer that is too large is formed. Since there are already many Si—H dangling bonds in the silicon nitride film, the term "NH pore" is used herein to distinguish the N—H pore from the Si—H dangling bond.

Figure 9B:
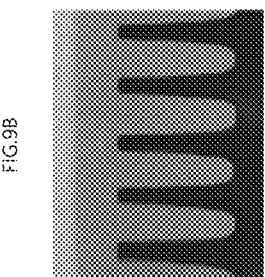
FIG. 9B is a transmission electron microscope (TEM) photograph illustrating a result of a method of processing a substrate, according to example embodiments of the present disclosure.
Figure 9A:
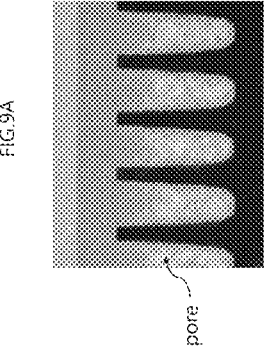
FIG. 9A is a TEM photograph for comparing to a result of a method of processing a substrate, according to example embodiments of the present disclosure.

FIG. 9A is an image of transmission electron microscope (TEM) photograph showing a result of a substrate processing method without the supply of the nitrogen-containing gas, and FIG. 9B is an image of TEM photograph showing a result of the substrate processing method with the supply of the nitrogen-containing gas according to example embodiments of the present disclosure. FIG. 9A shows the silicon nitride film formed in the gap by supplying only the silicon precursor source without the supply of the nitrogen-containing gas, that is, without the supply of the $NH_3$ plasma, and FIG. 9B shows the silicon nitride film formed in the gap by supplying the silicon precursor source together with the $NH_3$ plasma. As can be seen from FIG. 9A, it may be seen that when there is no supply of $NH_3$ plasma, micro NH pores may be formed in the silicon nitride film in the gap.

On the other hand, when a ratio of Si atoms to N atoms in the silicon nitride film is about 1:1 or less (i.e., about 1:≤1, for example, 1:0.5), that is, when the number of nitrogen atoms in the silicon nitride film is less than the number of silicon atoms therein, the formation of the cross-linking may be not smooth, and incomplete oligomerization may proceed. When the oligomerization incompletely proceeds, mechanical properties, such as strength of the formed silicon nitride film, may be deteriorated, and the silicon nitride film may also shrink in a post-treatment step to be described later. Therefore, by supplying the nitrogen-containing gas together with the silicon precursor source to solve the lack of nitrogen atoms in the silicon nitride film, nitrogen atoms may be additionally supplied in the silicon nitride film. On the other hand, when the ratio of Si atoms to N atoms in the silicon nitride film is about 1:1 or more (i.e., about 1:≥1, for example, 1:1.5), that is, when the number of nitrogen atoms in the silicon nitride film is greater than the number of silicon atoms therein, the formation of the cross-linking may be facilitated, which may facilitate the oligomerization, and thus may inhibit the formation of NH pores in the silicon nitride film.

Therefore, in order to facilitate the oligomerization of the silicon nitride film and to inhibit the formation of the NH pores in the silicon nitride film, it may be necessary to supply the nitrogen-containing gas with the silicon precursor source, and further to sufficiently provide the supply amount of nitrogen-containing gas relative to the silicon precursor source. For example, the silicon precursor and the nitrogen-containing gas may be supplied so that the ratio of the Si atoms to N atoms in the silicon nitride film becomes about 1:1 or more (i.e., about 1:≥1). In some embodiments, when $NH_3$ is used as the nitrogen-containing gas, the supply amount of $NH_3$ may be in the range of, for example, greater than 0 sccm to about 2,500 sccm, preferably about 200 sccm to about 2,000 sccm.

Referring back to FIG. 3, a post-treatment may be performed on the silicon nitride film formed on the substrate (240). The post-treatment may be to densify the surface of the silicon nitride film, and may have a technical benefit that may prevent external impurities, such as oxygen or carbon, from penetrating into the silicon nitride film. The post-treatment may be performed in various methods, for example, plasma treatment, UV treatment, or a rapid thermal process (RTP) treatment, and the like. Optionally, when the post-treatment is performed in the plasma treatment, the plasma treatment may be performed in an in-situ plasma treatment method, in which the plasma may be generated directly over the substrate while supplying He or Ar gas to the reaction space.

Hereinafter, according to example embodiments of the present disclosure, the method of processing the substrate for filling the gap with the silicon nitride film having flowability, specifically the gap-fill process, will be described.

FIGS. 4A to 4G are cross-sectional views illustrating a process sequence for explaining the gap-fill process according to example embodiments of the present disclosure.

Figure 4A:
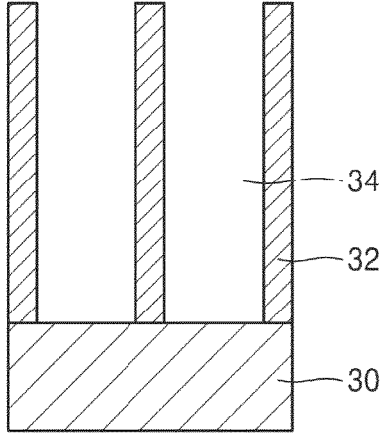
FIGS. 4A to 4G are cross-sectional views illustrating a process sequence for explaining a method of processing a substrate, according to example embodiments of the present disclosure.

Referring to FIG. 4A, a substrate 30 provided to the reaction space (not shown) in which the gap-fill process according to example embodiments of the present disclosure is performed, is shown. On a part of the surface of the substrate 30, a gap structure including a gap 34 that may have a certain depth in a vertical direction and a certain width in a horizontal direction is shown. The substrate 30 may include semiconductor materials, such as Si or Ge, or various compound semiconductor materials, such as SiGe, SiC, GaAs, InAs, and InP, and may include various substrates to be used in a display device or a semiconductor device, etc., such as silicon on insulator (SOI), silicon on sapphire (SOS), etc.

The gap 34 may be an STI generally used to define an active region of a semiconductor device in the semiconductor manufacturing process, and may be various types of recess regions formed on the surface of the substrate 30. In addition, the gap 34 may also be in a form of a via that penetrates a conductive layer between an insulating layer and another insulating layer, or penetrates an insulating layer between a conductive layer and another conductive layer. The gap 34 in FIG. 4A shows a gap 34 in which a part of a layer 32 formed on the surface of the substrate 30 is etched and removed. The layer 32 may include, for example, a conductive material, an insulating material, or a semiconductor material, or the like.

Although the layer 32 is shown as a single layer, the layer 32 may be a multilayer. Furthermore, the gap 34 may have a cylindrical shape, but the cross-sectional shape of the surface of the gap 34 may be various polygonal shapes, such as an ellipse, a triangle, a rectangle, or a pentagon, and the like. In addition, the gap 34 may have an island shape having various cross-sectional shapes of surface, but in some embodiments, the gap 34 may have a line shape on the substrate 30. Furthermore, the gap 34 may have a vertical profile having substantially the same width from the upper region of the gap 34, which is the inlet region of the gap 34, to the lower region thereof. In some embodiments, the gap 34 may have a non-vertical profile in which the width of the gap 34 decreases or increases linearly or stepwise from the upper region of the gap to the lower region thereof.

On the other hand, although FIG. 4A shows the gap structure formed on the substrate 30 in the form of layer 32 made of a material different from the substrate 30, the STI structure shows a case in which the gap 34 is formed in the substrate 30 itself. Therefore, the substrate herein may refer to only the substrate 30 itself, or the substrate herein may also refer to the substrate having various surface structures before forming the flowable film according to example embodiments of the present disclosure, for example, the flowable silicon nitride film is formed thereon.

Figure 4B:
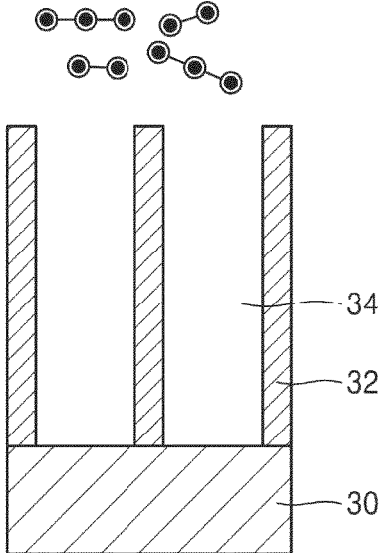

Referring to FIG. 4B, the silicon precursor and the nitrogen-containing gas may be supplied onto the substrate 30 on which the gap structure is formed, in the reaction space in which the gap-fill process is performed. FIG. 4B shows the oligomerization process of the silicon precursor source, together with the supply of silicon precursors and nitrogen-containing gases. As the silicon precursor used in example embodiments of the present disclosure, the oligomeric silicon source having a molecular structure that is not excessively simple and not excessively complicated, for example, the chain structure of 2 to about 10 chains, may be used. The oligomeric silicon source may include, for example, dimer-TSA, trimer-TSA, tetramer-TSA, pentamer-TSA, hexamer-TSA, heptamer-TSA, octamer-TSA, and the like.

In some embodiments, the oligomeric silicon source may be supplied alone to the reaction space, respectively, and for example, dimer-TSA as the silicon source may be supplied alone to the reactive space, and in other embodiments, trimer-TSA as the silicon source may be supplied alone to the reactive space. In addition, in some embodiments, two or more kinds of silicon precursor sources may be supplied together to the reaction space. In some embodiments, dimer-TSA and trimmer-TSA may be simultaneously supplied as the silicon precursor source, in some other embodiments, trimmer-TSA and tetramer-TSA may be simultaneously supplied as the silicon precursor source, and in some other embodiments, dimer-TSA, trimmer-TSA, and tetramer-TSA may be simultaneously supplied to the reaction space.

FIG. 4B shows that as silicon precursor sources, for example, dimer-TSA and trimmer-TSA may be supplied simultaneously. In some embodiments, the oligomeric silicon precursor source synthesized in advance to have chain structures of 2 to about 10 may be supplied to the reaction space. In some embodiments, while the oligomeric silicon precursor source having a small chain structure flows on the exposed surface of the substrate, the oligomeric silicon precursor source may be formed into a structure having about 10 chain structures through the oligomerization reaction and condensation reaction.

On the other hand, the nitrogen-containing gas to be used in example embodiments of the present disclosure may include at least one selected from $N_2$, $N_2O$, $NO_2$, $NH_3$, $N_2H_2$, $N_2H_4$, at least one of radicals thereof, and mixtures thereof. In one embodiment, $NH_3$ may be used as the nitrogen-containing gas.

On the other hand, the temperature of the substrate in the reaction space may be maintained, for example, about 100° C. or less, preferably about 30° C. to about 70° C. The process temperature in the reaction space or the temperature of the vessel containing the silicon source may be maintained, for example, about 100° C. or less, preferably about 30° C. to about 70° C. Then, RF power of about 100 W to about 500 W, preferably about 200 W to about 400 W, may be applied to the reaction space to generate a plasma state in the reaction space. In this case, RF frequency used may be in the range of 13 MHz to 60 MHz, preferably about 20 MHz to about 30 MHz. In order to generate a plasma state in the reaction space, in the example embodiments of the present disclosure, the in-situ plasma treatment may be used, in which RF power is directly applied to the reaction space while supplying the silicon precursor source and the nitrogen-containing gas together to the reaction space, to generate plasma directly over the substrate.

Figure 4C:
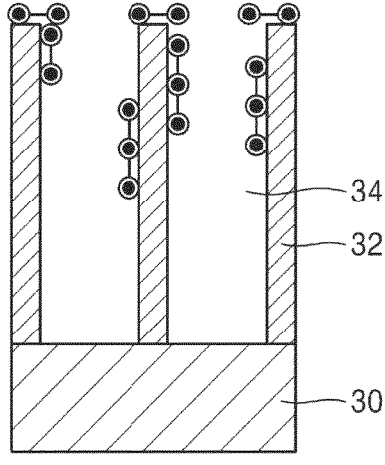

Referring to FIG. 4C, FIG. 4C shows a process of the oligomerization reaction and condensation reaction between silicon precursor source molecules supplied to the reaction space. That is, the oligomeric silicon precursor supplied to the reaction space together with the nitrogen-containing gas may have flowability and flow on the exposed surface of the substrate by thermal energy supplied to the substrate in the reaction space under the plasma state, and as the oligomeric silicon precursor flows on the substrate, the oligomeric silicon precursor source molecules may be bonded to each other to form the structure having about 10 chain structures through the oligomerization reaction and condensation reaction.

Figure 4D:
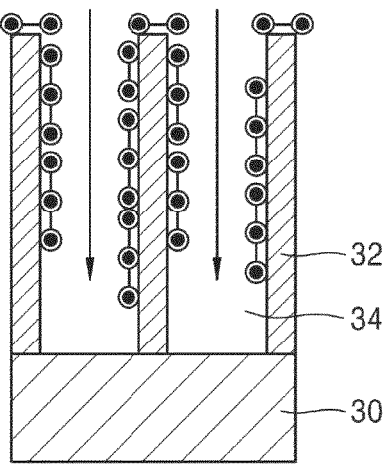

Referring to FIG. 4D, the oligomers having flowability may flow down towards the lower region of the gap 34 under the influence of gravity along the exposed surface of the substrate 30 on which the gap 34 is formed on the surface, and along the exposed surface of the gap 34.

Figure 4E:
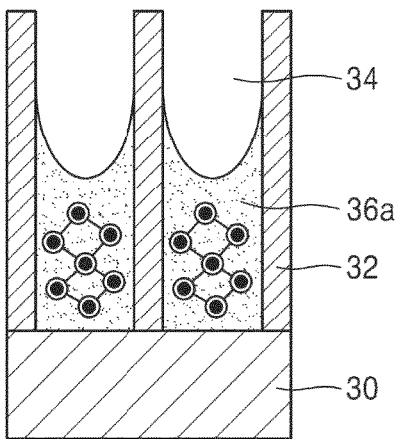

Referring to FIG. 4E, along the exposed surface of the gap 34, the oligomers having flowability may continuously flow down towards the lower region of the gap 34, so that the silicon nitride film 36a may partially fill the gap 34 in a bottom-up manner from the lower region of the gap 34. At this time, the silicon nitride film 36a filling the gap 34 may have a circular ring-shaped cross-linking structure, as shown in FIG. 6, through crosslinking.

Figure 4F:
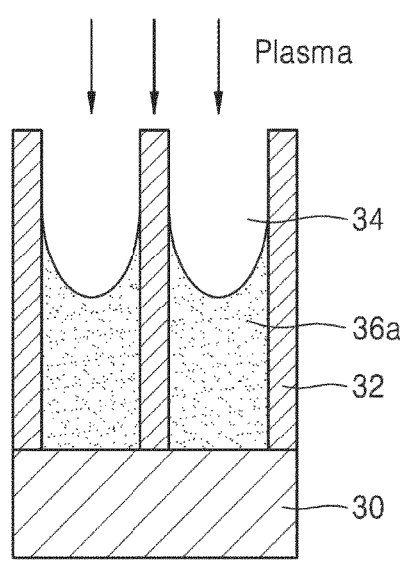

Referring to FIG. 4F, the post-treatment may be performed on the silicon nitride film 36a at least partially filling the gap 34. As described above, the post-treatment may be to densify the surface of the silicon nitride film 36a, and may have a technical benefit that may prevent external impurities, such as oxygen or carbon, from penetrating into the silicon nitride film. The post-treatment may be performed in various methods, for example, plasma treatment, UV treatment, or a rapid thermal treatment, and the like. In this embodiment, the post-treatment may be performed in plasma treatment and the plasma treatment may be performed in an in-situ plasma processing method, in which plasma may be generated over the substrate while supplying He or Ar gas in the reaction space.

Figure 4G:
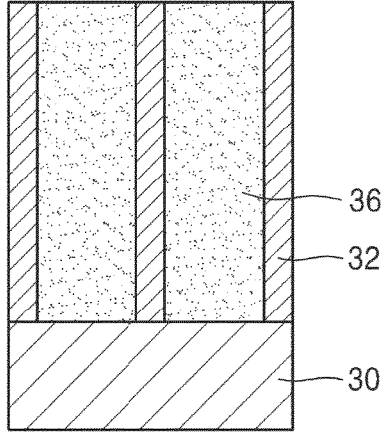

Referring to FIG. 4G, after fully filling the gap 34 with the silicon nitride film 36 on which the post-treatment is performed, the surface of the substrate may be planarized through, for example, an etch-back process so that an upper surface of the layer 32 is exposed. The post-treatment may be performed on the silicon nitride film 36a after at least partially filling the gap 34 with the silicon nitride film 36a, and then after at least partially further filling the gap 34 with the silicon nitride film 36a, the post-treatment may be further performed on the silicon nitride film 36a. Thereafter, the gap 34 may be fully filled with the silicon nitride film 36 while repeating a filling process and a post-treatment process. The filling process of the gap 34 will be described in detail later.

Figure 7:
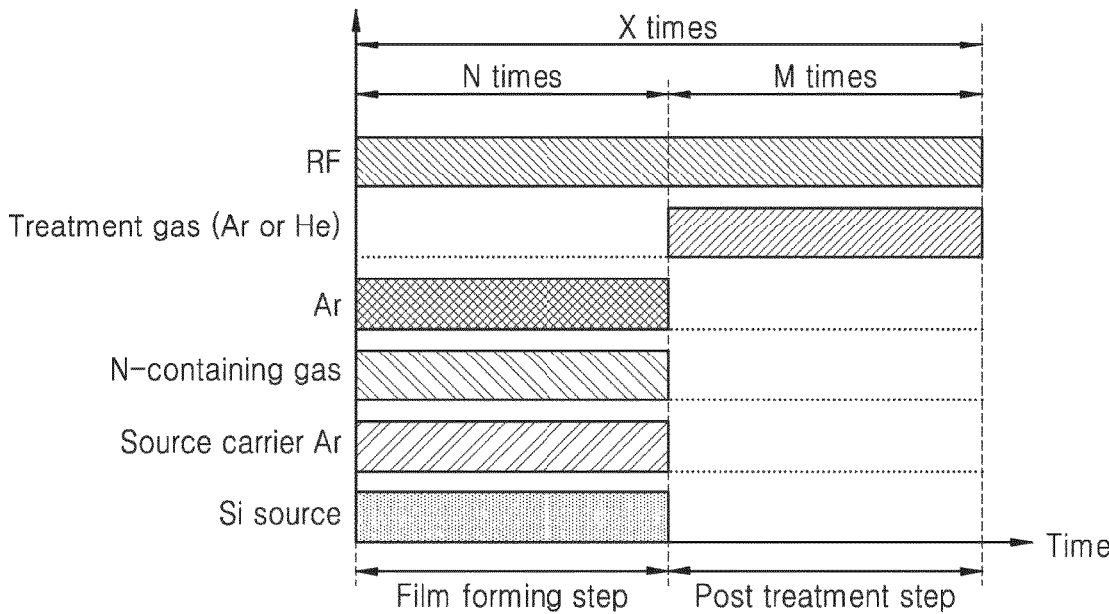
FIG. 7 is a diagram illustrating a process sequence of a method of processing a substrate, according to example embodiments of the present disclosure.

FIG. 7 is a diagram illustrating a process sequence of a method of processing a substrate, according to example embodiments of the present disclosure.

Referring to FIG. 7, the method of processing a substrate, according to example embodiments of the present disclosure, for example, a process sequence of the gap-fill process, is shown. The gap-fill process of the present disclosure may include a film forming step and a post-treatment step as indicated on the horizontal axis. Specifically, the film forming step may correspond to FIGS. 4B to 4E, and the post-treatment step may correspond to FIG. 4F.

Referring to FIG. 7, the film forming step may be a step of forming the flowable film, for example, the flowable silicon nitride film 36a in the gap 34. In the film forming step, the silicon precursor source and the nitrogen-containing gas may be supplied together in the reaction space. At this time, the silicon precursor source may be carried by an argon source carrier gas, and in the reaction space, a purge gas, such as argon gas, may continuously flow.

On the other hand, although not specifically shown, a purge step may be provided between the film forming step and the post-treatment step, or between the post-treatment step and the film forming step, and in the purge step, the excess silicon precursor source or the nitrogen-containing gas, or reaction by-products may be removed. On the other hand, in the film forming step, the silicon precursor source or the nitrogen-containing gas may be continuously supplied, but may be supplied intermittently and sequentially. In this case, the purge may be performed during a step in which the silicon precursor source or the nitrogen-containing gas is not supplied.

As described above, as the silicon precursor source used in example embodiments of the present disclosure, for example, the oligomeric silicon precursor source having two to about 10 chain structures, may be used. The nitrogen-containing gas to be used in example embodiments of the present disclosure may include at least one selected from $N_2$, $N_2O$, $NO_2$, $NH_3$, $N_2H_2$, $N_2H_4$, at least one of radicals thereof, and mixtures thereof.

In the film forming step, the temperature of the substrate in the reaction space may be maintained, for example, about 100° C. or less, preferably about 30° C. to about 70° C. The temperature of the substrate in the reaction space described above may be maintained by maintaining the process temperature in the reaction space or the temperature of vessel containing the silicon precursor source, for example, at about 100° C. or less, preferably at about 100° C. to about 70° C. In addition, a relatively low RF power, for example, about 100 W to about 500 W, preferably about 200 W to about 400 W, may be applied to generate a plasma state in the reaction space. The pressure in the reaction space during the film forming step may be maintained in the range of about 0.5 Torr to about 10 Torr, preferably about 2 Torr to about 6 Torr.

Referring back to FIG. 7, the post-treatment step following the film forming step may be a step of densifying the surface of the flowable film at least partially filling the gap. The post-treatment step may correspond to FIG. 4F. The post-treatment step may be to densify the surface of the flowable film, for example, the silicon nitride film 36a at least partially filling the gap 34, and may prevent external impurities, such as oxygen or carbon, from penetrating into the silicon nitride film 36a. The post-treatment may be performed, for example, by the plasma treatment. The plasma treatment may be performed by applying relatively high RF power, for example, about 300 W to about 1,500 W, preferably about 500 W to about 1,000 W, to the reaction space while supplying a process gas, such as He or Ar gas. The pressure in the reaction space during the film forming step may be maintained in the range of about 0.5 Torr to about 10 Torr, preferably about 2 Torr to about 6 Torr.

On the other hand, the film forming step and the post-treatment step may be performed at the same process temperature, and by increasing second RF power applied to the reaction space in the post-treatment step greater than first RF power applied to the reaction space in the film forming step, the surface of the film to be formed may be easily densified.

Alternatively, the film forming step and the post-treatment step may be performed in the plasma state to which RF power of the same intensity is applied, and by increasing a second temperature applied to the reaction space in the post-treatment step higher than a first temperature applied to the reaction space in the film forming step, the surface of the film to be formed may be easily densified.

On the other hand, as shown in FIG. 7, the film forming step may be performed N times, and the post-treatment step may be performed M times. This will be described in detail in connection with FIG. 8.

Figure 8:
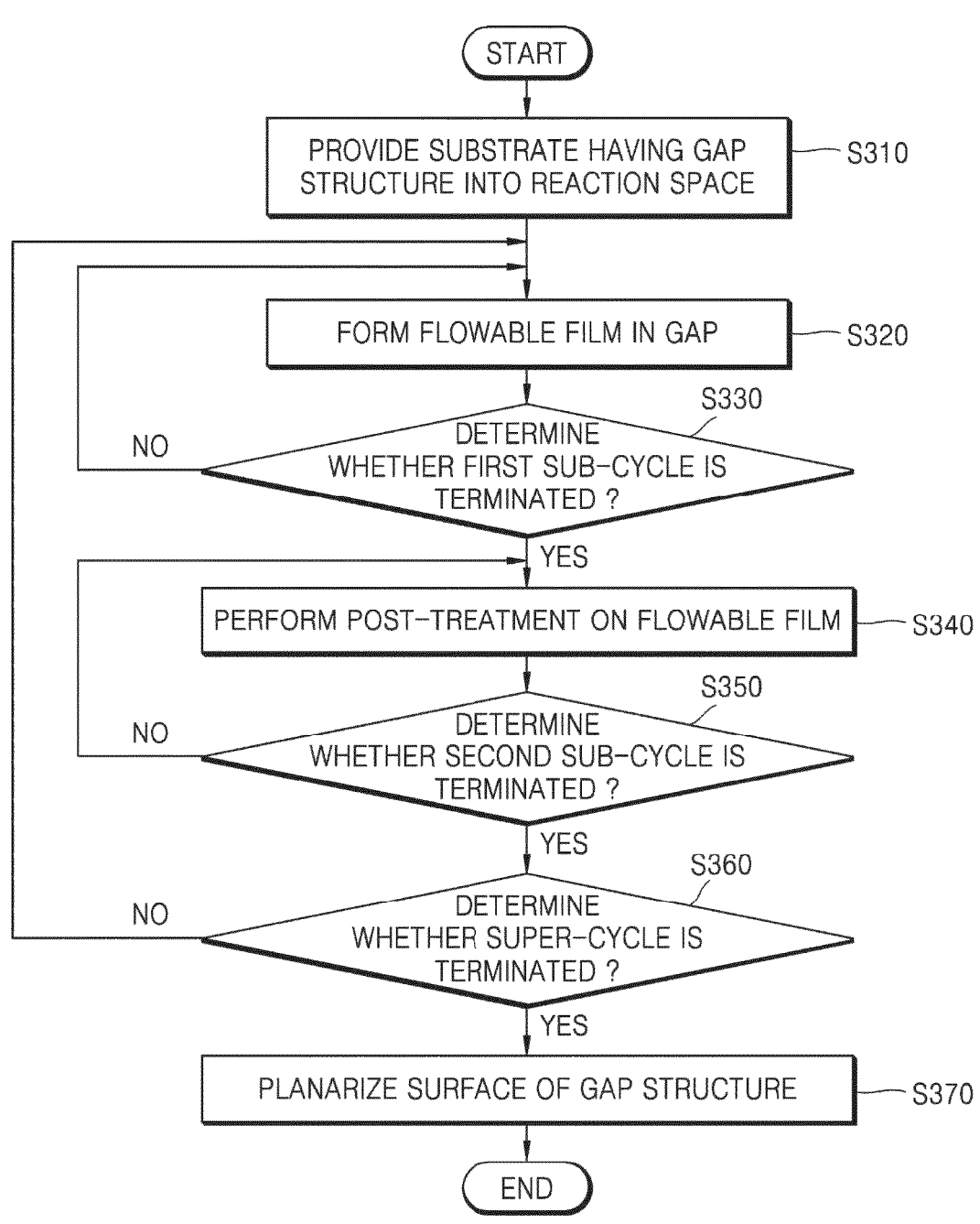
FIG. 8 is a process flow diagram illustrating a method of processing a substrate, according to example embodiments of the present disclosure.

FIG. 8 is a flow diagram illustrating a method of processing a substrate, according to example embodiments of the present disclosure. Referring to FIG. 8 with reference to FIGS. 4A to 4F and FIG. 7, the gap-fill process according to example embodiments of the present disclosure will be described.

First, in step S310, the substrate having a gap structure may be provided to the reaction space. Step S310 may correspond to a process step of FIG. 4A.

In step S320, the flowable film may be formed in the gap. Step S320 may correspond to processes step of FIGS. 4B to 4G. In addition, step S320 may correspond to a part of the film forming step of FIG. 7. That is, step S320 may be performed until the flowable film, for example, the flowable silicon nitride film 36a in FIG. 4E and FIG. 4F at least partially fills the gap 34 as shown in FIG. 4G. Step S320 to form the flowable film in the gap may be referred to as a first sub-cycle, and the first sub-cycle may be performed repeatedly a plurality of times. In some embodiments, if necessary, the first sub-cycle may be performed only once.

In step S330, whether the first sub-cycle is terminated may be determined. Whether the first sub-cycle is terminated may be determined in a variety of ways. After setting the number of repetitions of the first sub-cycle to a program in advance, whether the first sub-cycle is terminated may be determined by whether the number of repetitions set in the program is reached. Alternatively, after setting a process time to the program in advance, whether the first sub-cycle is terminated may be determined by whether the process time set in the program is reached. In addition, after identifying the height and width of the gap 34 in advance, whether the first sub-cycle is terminated may be determined by whether the thickness of the flowable film formed in the gap 34 after the first sub-cycle is reached to a certain thickness set in advance. When it is determined as 'NO' in step S330, step S320 may be repeated, and when it is determined as 'YES' in step S330, it may proceed to step S340.

In step S340, the post-treatment on the flowable film formed in the gap may be performed. Step S340 may correspond to a process step of FIG. 4F. Alternatively, step S340 may proceed after a part of the film forming step of FIG. 7 is performed, that is, after the flowable film partially fills the gap 34. Step S340 in which the post-treatment is performed on the flowable film may be referred to as a second sub-cycle, and the second sub-cycle may be repeatedly performed a plurality of times. In some embodiments, if necessary, the second sub-cycle may be performed only once.

In step S350, whether the second sub-cycle is terminated may be determined. Whether the second sub-cycle is terminated may be determined in a variety of ways. For example, after setting the number of repetitions of the second sub-cycle to the program in advance, whether the second sub-cycle is terminated may be determined by whether the number of repetitions set in the program is reached. Alternatively, after setting the process time to the program in advance, whether the second sub-cycle is terminated may be determined by whether the process time set in the program is reached. When it is determined as 'NO' in step S350, step S340 may be repeated, and when it is determined as YES' in step S350, it may proceed to step S360.

In step S360, whether a super-cycle is terminated may be determined. The super-cycle may include the first sub-cycle and the second sub-cycle. In some embodiments, one super-cycle may include one first sub-cycle and one second sub-cycle, but in other embodiments, one super-cycle may include a plurality of times of the first sub-cycles (e.g., N times in FIG. 7) and/or a plurality of times of the second sub-cycles (e.g., M times in FIG. 7).

Whether the super-cycle is terminated may be determined in a variety of ways. After setting the number of repetitions of the first sub-cycle and the number of repetitions of the second sub-cycle (for example, N times and M times, respectively) to the program in advance, whether the super-cycle is terminated may be determined by whether the numbers of repetitions set in the program is reached. Alternatively, after setting the process times of the first and second sub-cycles to the program in advance, whether the super-cycle is terminated may be determined by whether the process times set in the program is reached. Alternatively, after setting the thickness of the flowable film to fill the gap 34 in advance, whether the super-cycle is terminated may be determined by whether the thickness of the flowable film formed in the gap 34 is reached to the thickness set in advance. Alternatively, whether the super-cycle is terminated may be determined by whether the flowable film fully fills the gap 34.

On the other hand, the super-cycle may be terminated even before the flowable film fully fills in the gap 34. For example, when the aspect ratio of the gap 34 is sufficiently small before the flowable film fully fills the gap 34 so that there is no risk of the occurrence of voids in the gap 34 in a subsequent gap-fill process, the super-cycle may be terminated and a remaining unfilled portion of the gap 34 may be filled through a conventional plasma enhanced chemical vapor deposition method. In step S360, when it is determined as 'NO', the process may return to step S320 to continue the first sub-cycle forming the flowable film in the gap 34 and the second sub-cycle performing the post-treatment on the flowable film. In step S360, when it is determined as 'YES', it may proceed to step S370.

In step S370, when it is determined that the super-cycle is terminated, the surface of the gap structure may be planarized. Step S370 may correspond to a process step of FIG. 4G. For example, the surface of the substrate may be planarized through the etch back process to complete the gap-fill process.

Embodiments

Hereinafter, a substrate processing process according to example embodiments of the present disclosure was performed. Trimer-TSA was used as the silicon precursor source and NH₃ gas was used as the nitrogen-containing gas. The film forming step and the post-treatment step of FIG. 7 were in-situ performed under the same temperature conditions in the same reactor. Specific process conditions are shown in Table 1 below.

TABLE 1

| Step | | Conditions | | Time (sec) |
|---|---|---|---|---|
| Film forming step | Gas (sccm) | Ar | 0 to 3000 (preferably 500 to 2000) | <600 |
| | | NH₃ | 0 to 2500 (preferably 500 to 2000) | |
| | | Carrier Ar | 0 to 3000 (preferably 500 to 2000) | |
| | Plasma condition | RF Power (W) | 100 to 500 (preferably 200 to 400) | |
| | | RF frequency (MHz) | 13 to 60 (preferably 20 to 30) | |
| | | Process pressure (Torr) | 0.5 to 10 (preferably 2 to 6) | |

TABLE 1-continued

| Step | | | Conditions | Time (sec) |
|---|---|---|---|---|
| | Process Temperature (° C.) | | 0 to 100 (preferably 30 to 70) | |
| | Si source | | Trimer-TSA | |
| | Si source vessel temperature (° C.) | | 70 | |
| Post treatment step | Gas (sccm) | Ar (or He) | 0 to 3000 (preferably 200 to 2000) | <1800 |
| | Plasma condition | RF Power (W) | 300 to 1500 (preferably 500 to 1000) | |
| | | RF frequency (MHz) | 13 to 60 (preferably 20 to 30) | |
| | Process pressure (Torr) | | 0.5 to 10 (preferably 2 to 6) | |
| | Process Temperature (° C.) | | 0 to 100 (preferably 30 to 70) | |

Figure 10:
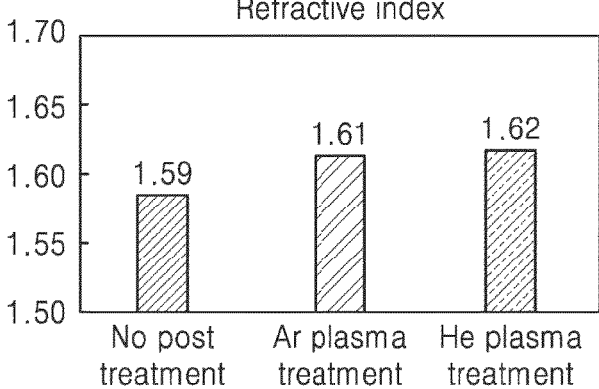
FIG. 10 is a comparison graph of a refractive index of a silicon nitride film formed according to example embodiments of the present disclosure.

FIG. 10 is a comparison graph of a refractive index of a silicon nitride film formed according to example embodiments of the present disclosure.

Referring to FIG. 10, it is a comparison graph showing the refractive indices of silicon nitride films formed with respect to a case in which the post-treatment step is not performed, a case in which Ar plasma treatment is performed in the post-treatment step, and a case in which He plasma treatment is performed in the post-treatment step, respectively. The refractive index when the post-treatment step is not performed is 1.59, the refractive index in the case of the Ar plasma treatment in the post-treatment step is 1.61, and the refractive index in the case of the He plasma treatment is 1.62. Therefore, compared to the case in which the post-treatment step is not performed, the refractive indices increased in both cases of the Ar plasma treatment and the He plasma treatment. Since a high refractive index means that the film is densified, it may be seen that the degree of densification of the formed film is improved by performing the post-treatment step.

Figure 11:
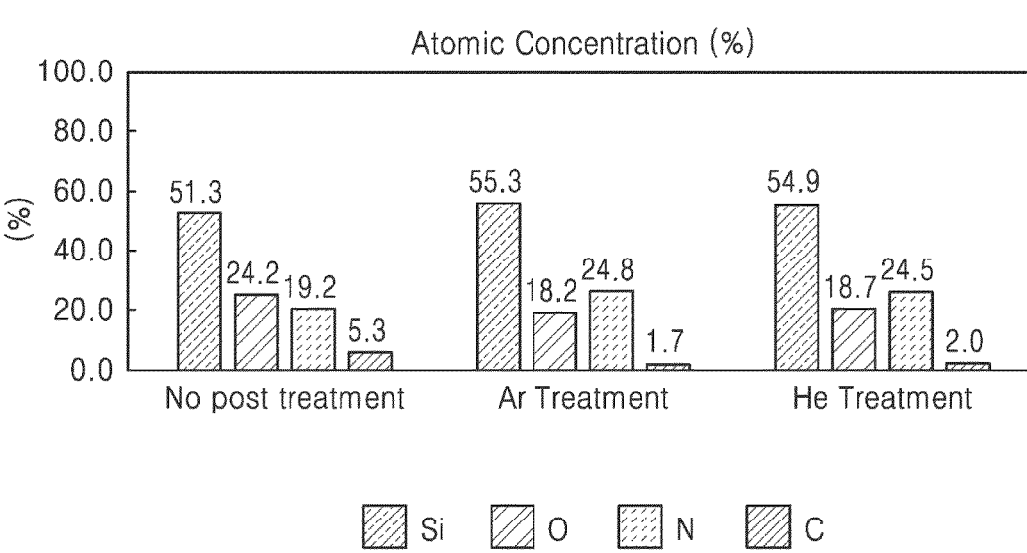
FIG. 11 is a comparison graph of an external impurity content contained in a silicon nitride film formed according to example embodiments of the present disclosure.

FIG. 11 is a comparison graph of an external impurity content contained in the silicon nitride film formed according to example embodiments of the present disclosure.

Referring to FIG. 11, it is a comparison graph showing the contents of oxygen and carbon, which are external impurities contained in the formed silicon nitride film, in the atomic concentration (atomic %), with respect to a case in which the post-treatment step is not performed, a case in which Ar plasma treatment is performed in the post-treatment step, and a case in which He plasma treatment is performed in the post-treatment step, respectively. The contents of oxygen and carbon in the case in which the post-treatment step is not performed are 24.2 atomic % and 5.3 atomic %, respectively, the contents of oxygen and carbon in the case in which Ar plasma treatment is performed in the post-treatment step are 18.2 atomic % and 1.7 atomic %, respectively, and the contents of oxygen and carbon in the case in which He plasma treatment is performed in the post-treatment step are 18.7 atomic % and 2.0 atomic %, respectively. Therefore, compared to the case in which the post-treatment step is not performed, the contents of oxygen and carbon decreased in both cases of the Ar plasma treatment and the He plasma treatment. That is, since the surface of the film formed through the plasma post-treatment is densified, it may be seen that the penetration of external impurities, such as oxygen and carbon, may decrease.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of processing a substrate, the method comprising:
   providing the substrate in which a gap is formed in a surface thereof to a reaction space;
   supplying an oligomeric silicon precursor and a nitrogen-containing gas to the reaction space;
   forming a silicon nitride film having flowability on the substrate to fill at least a portion of the gap of the substrate while maintaining the reaction space in a plasma state; and
   densifying the silicon nitride film,
   wherein a pressure within the reaction space is in the range of about 0.5 Torr to about 10 Torr, and
   wherein the silicon precursor comprises a trisilylamine (TSA) having 2 to 10 repeating units.

2. The method of processing a substrate of claim 1, wherein the oligomeric silicon precursor comprises one or more of dimer-TSA, trimer-TSA, tetramer-TSA, pentamer-TSA, hexamer-TSA, heptamer-TSA, octamer-TSA.

3. The method of processing a substrate of claim 1, wherein the nitrogen-containing gas comprises at least one selected from $N_2$, $N_2O$, $NO_2$, $NH_3$, $N_2H_2$, $N_2H_4$, at least one of radicals thereof, and mixtures thereof.

4. The method of processing a substrate of claim 1, wherein the oligomeric silicon precursor comprises trimer-trisilylamine (TSA) and the nitrogen-containing gas comprises $NH_3$.

5. The method of processing a substrate of claim 1, wherein, in the step of forming the silicon nitride film, a temperature of the substrate is maintained between about 0° C. and about 100° C.

6. The method of processing a substrate of claim 5, wherein, in the step of forming the silicon nitride film, the temperature of the substrate is maintained between about 30° C. and about 70° C.

7. The method of processing a substrate of claim 1, wherein, in the step of supplying the oligomeric silicon precursor and the nitrogen-containing gas, the oligomeric silicon precursor and the nitrogen-containing gas are supplied so that the ratio of the Si atoms to N atoms in the silicon nitride film is 1:1 or more.

8. The method of processing a substrate of claim 1, wherein, in the step of forming the silicon nitride film, while supplying the oligomeric silicon precursor and the nitrogen-containing gas to the reaction space, RF power is applied to the reaction space to directly generate plasma over the substrate by an in-situ plasma treatment method.

9. The method of processing a substrate of claim 1, wherein the step of densifying the silicon nitride film is performed using any one selected from plasma treatment, UV treatment, or a rapid thermal process, for the silicon nitride film.

10. The method of processing a substrate of claim 9, wherein the step of densifying the silicon nitride film is performed using plasma treatment, and the plasma treatment is performed by an in-situ plasma treatment method in which plasma is directly generated over the substrate while supplying He or Ar gas.

11. The method of processing a substrate of claim 10, wherein the steps of forming the silicon nitride film and densifying the silicon nitride film are performed at the same process temperature, and in the step of densifying the silicon nitride film, second RF power that is greater than first RF power applied to the reaction space in the step of forming the silicon nitride film is applied to the reaction space.

12. The method of processing a substrate of claim 11, wherein the first RF power is in a range of about 100 W to about 500 W, and the second RF power is in the range of about 300 W to about 1,500 W.

13. The method of processing a substrate of claim 10, wherein the steps of forming the silicon nitride film and densifying the silicon nitride film are performed under RF power of the same intensity, and the step of densifying the silicon nitride film is performed at a second process temperature that is greater than a first process temperature in the step of forming the silicon nitride film.

14. The method of processing a substrate of claim 1, wherein the steps of forming the silicon nitride film and densifying the silicon nitride film are repeatedly performed a plurality of times, respectively.

15. The method of processing a substrate of claim 1, wherein the steps of forming the silicon nitride film and densifying the silicon nitride film constitute one super-cycle, and the super-cycle is performed a plurality of times according to the degree of filling of the silicon nitride film within the gap.

16. A method of processing a substrate, the method comprising:
    providing the substrate to a reaction space;
    supplying an oligomeric silicon precursor having 2 to about 10 chain structures comprising trisilylamine and a nitrogen-containing gas to the reaction space; and
    forming a silicon nitride film having flowability on the substrate while maintaining the reaction space in a plasma state,
    wherein a pressure within the reaction space is in the range of about 0.5 Torr to about 10 Torr.

17. The method of processing a substrate of claim 16, further comprising densifying the silicon nitride film after the step of forming the silicon nitride film.

18. The method of processing a substrate of claim 16, wherein the nitrogen-containing gas comprises at least one selected from $N_2$, $N_2O$, $NO_2$, $NH_3$, $N_2H_2$, $N_2H_4$, at least one of radicals thereof, and mixtures thereof.

19. The method of processing a substrate of claim 16, wherein, in the step of forming the silicon nitride film, the temperature of the substrate is maintained between about 30° C. and about 70° C.

20. The method of processing a substrate of claim 16, wherein, in the step of supplying the oligomeric silicon precursor and the nitrogen-containing gas, two or more kinds of oligomeric silicon precursor are supplied together to the reaction space.

* * * * *